US010002207B2

(12) United States Patent
Pettersson

(10) Patent No.: US 10,002,207 B2
(45) Date of Patent: Jun. 19, 2018

(54) SYSTEMS AND METHODS FOR OPTIMIZING PRODUCTION OF PACKAGING PRODUCTS

(75) Inventor: Niklas Pettersson, Sandy, UT (US)

(73) Assignee: Packsize LLC, Salt Lake City, UT (US)

( * ) Notice: Subject to any disclaimer, the term of this patent is extended or adjusted under 35 U.S.C. 154(b) by 705 days.

(21) Appl. No.: 13/805,585

(22) PCT Filed: Jun. 28, 2011

(86) PCT No.: PCT/US2011/042100
§ 371 (c)(1),
(2), (4) Date: Mar. 27, 2013

(87) PCT Pub. No.: WO2012/006050
PCT Pub. Date: Jan. 12, 2012

(65) Prior Publication Data
US 2013/0204419 A1 Aug. 8, 2013

Related U.S. Application Data

(60) Provisional application No. 61/359,753, filed on Jun. 29, 2010.

(51) Int. Cl.
*G06F 19/00* (2018.01)
*G06F 17/50* (2006.01)
(Continued)

(52) U.S. Cl.
CPC ............. *G06F 17/50* (2013.01); *B65B 5/02* (2013.01); *B65B 59/00* (2013.01); *B31B 50/006* (2017.08); *B65B 2210/04* (2013.01)

(58) Field of Classification Search
None
See application file for complete search history.

(56) References Cited

U.S. PATENT DOCUMENTS 5,936,863 A * 8/1999 Kostelnik et al. ............ 700/171
6,689,035 B1 2/2004 Gerber
(Continued)

FOREIGN PATENT DOCUMENTS

| JP | 0736967 | 2/1995 |
| JP | 07244688 | 9/1995 |

(Continued)

OTHER PUBLICATIONS

International Search Report and Written Opinion for PCT/US11/042100 dated Nov. 14, 2011.

*Primary Examiner* — Michael D Masinick
*Assistant Examiner* — Jay Jung
(74) *Attorney, Agent, or Firm* — Workman Nydegger

(57) ABSTRACT

The present invention extends to methods, systems, and computer program products for optimizing production of packaging products. Packaging products can be automatically produced on-demand and can be optimized based on stored and/or real-time information. In some embodiments, a request for a packaging product is received and a real-time design optimization system accesses information about one or more design groups. The one or more design groups include multiple design options. The multiple design options are scored based on stored and/or real-time criteria. Based on the score, one or more top designs are identified for production and/or selection by an operator of the system.

18 Claims, 7 Drawing Sheets

(51) Int. Cl.
*B65B 59/00* (2006.01)
*B65B 5/02* (2006.01)
*B31B 50/00* (2017.01)

(56) References Cited

U.S. PATENT DOCUMENTS

| | | | |
|---|---|---|---|
| 6,895,549 B1 | 5/2005 | Albright | |
| 6,995,762 B1* | 2/2006 | Pavlidis et al. | 345/419 |
| 7,647,752 B2 | 1/2010 | Magnell | |
| 7,788,883 B2* | 9/2010 | Buckley et al. | 53/456 |
| 8,296,101 B1* | 10/2012 | Barlow et al. | 702/182 |
| 2004/0170315 A1* | 9/2004 | Kosaka et al. | 382/154 |
| 2005/0114193 A1 | 5/2005 | Kroening | |
| 2006/0129372 A1* | 6/2006 | Gallarda et al. | 703/22 |
| 2006/0241791 A1* | 10/2006 | Pokorny et al. | 700/67 |
| 2008/0004931 A1* | 1/2008 | Kambs et al. | 705/8 |
| 2008/0020916 A1* | 1/2008 | Magnell | 493/65 |
| 2009/0287717 A1 | 11/2009 | Gombert | |
| 2010/0118122 A1* | 5/2010 | Hartman | 348/46 |
| 2010/0241253 A1* | 9/2010 | Edwards | 700/90 |
| 2010/0287879 A1* | 11/2010 | Donati et al. | 53/52 |
| 2011/0149337 A1* | 6/2011 | Goetz | G06F 3/1211 358/1.15 |

FOREIGN PATENT DOCUMENTS

| | | |
|---|---|---|
| JP | 11195049 | 7/1999 |
| JP | 2002145219 | 5/2002 |
| JP | 2005267277 | 9/2005 |
| JP | 2006185207 | 7/2006 |
| WO | 2012006050 | 1/2012 |

* cited by examiner

Packaging Design Table 301

| Design Groups | | Design Features | | | | Preference Score | Options | | | Restrictions | Description |
|---|---|---|---|---|---|---|---|---|---|---|---|
| | | Aesthetics | Labor Prod. Cap. | Ass'y Mat'l Cost... | Protection | | Rotate? | Mirror? | Multiple-Outs? | | |
| DG1 | | | | | | | | | | | |
| | MD1 | Expand To Review | | | | | | | | | |
| | MD2 | Expand To Review | | | | | | | | | |
| | MD3 | | | | | | | | | | |
| | PD1 | 2 | 4.5 | 5.1 | $0.12 | 2 | 42 | Yes | Yes | Yes | Max Dimension = 34 in | For Fragile or Sensitive Objects |
| | PD2 | 5 | 3.8 | 5.7 | $0.11 | 6.5 | 63 | Yes | No | Yes | Only Prod. Machine 8 | RSC Style Box |
| | PD3 | 4 | 5.2 | 5.4 | $0.09 | 4 | 58 | No | Yes | Yes | N/A | Full-Size Top and Bottom Flaps |
| | PD4 | 3 | 3.7 | 6.1 | $0.16 | 5 | 51 | No | Yes | No | N/A | Integral Corner Protectors |
| | PD5 | 5 | 7.7 | 5.3 | $0.18 | 8 | 76 | No | Yes | Yes | Max L/W Ratio = 7:1 | Dimensions A/B/C=L/W/H |
| | PD6 | 3 | 6.1 | 5.4 | $0.14 | 7 | 69 | No | No | No | Nat'l Thickness <=.375 in. | Dimensions A/B/C=L/H/W |
| | PD7 | 5 | 5.4 | 6.2 | $0.10 | 4.5 | 55 | Yes | Yes | Yes | Nat'l Thickness <=.375 in. | Dimensions A/B/C=W/L/H |
| | ... | | | | | | | | | | | Dimensions A/B/C=W/H/L |
| | | | | | | | | | | | | Dimensions A/B/C=H/L/W |
| | PDN | | | | | | | | | | | Dimensions A/B/C=H/W/L |
| | | | | | | | | | | | | with z vertical dividers |
| | MD4 | 4 | 7 | 5.2 | $0.12 | 6.75 | 65 | Yes | Yes | No | N/A | With 2 horizontal dividers |
| | MDN | Expand To Review | | | | | | | | | | Two Piece Templates |
| DG2 | | Expand To Review | | | | | | | | | | 413 Style Box |
| DG3 | | Expand To Review | | | | | | | | | | Where High Throughput is Needed |
| DG4 | | Expand To Review | | | | | | | | | | For High-End Customers or Products |
| DG5 | | Expand To Review | | | | | | | | | | For Large Products |
| | | | | | | | | | | | | For Compartmentalized Boxes |
| DGN | | Expand To Review | | | | | | | | | | For Irregular Shaped Objects |

*Fig. 3*

PACKAGING INFORMATION

Box Size:

Length: [      ] inches

Width: [      ] inches

Height: [      ] inches

Quantity Needed: [      ]

Design Group:
- DG1 - For Fragile or Sensitive Objects — 302a
- DG2 - Where High Throughput is Needed — 302b
- DG3 - For High-End Customers or Products — 302c
- DG4 - For Large Products — 302d
- DG5 - For Compartmentalized Boxes — 302e
- . . .
- DGN - For Irregular Shaped Objects — 302f

PRODUCTION CONDITIONS

☒ Normal Production
☐ Slow Production
☐ Production Halted

Production Time Cost: $ [      ]

AVAILABLE PRODUCTION MACHINES

☒ Machine 102
☒ Machine 2
☐ Machine 3

[ SUBMIT ]

User Interface 401

Fig. 4

PACKAGING MATERIALS TABLE 501

| Name | Type | Width (in.) | Thickness (in.) | Quantity (in.²) | Cost (per ft.³) |
|---|---|---|---|---|---|
| A | Fanfold | 18 | 0.125 | 85000 | $0.01 |
| B | Fanfold | 30 | 0.25 | 120000 | $0.03 |
| C | Rolled | 30 | 0.25 | 12000 | $0.03 |
| D | Fanfold | 42 | 0.375 | 95000 | $0.05 |
| E | Rolled | 45 | 0.25 | 51000 | $0.04 |
| ... | | | | | |
| N | Fanfold | 108 | 0.125 | 47000 | $0.02 |

Fig. 5A

MACHINE DATA TABLE 502

| Machine | Cost (per sec) | Available Mat'ls |
|---|---|---|
| M102 | $0.11 | A,B,N |
| M2 | $0.09 | A,D,N |
| M3 | $0.07 | C,E |

Fig. 5B

SYSTEMS AND METHODS FOR OPTIMIZING PRODUCTION OF PACKAGING PRODUCTS

CROSS-REFERENCE TO RELATED APPLICATIONS

This application claims priority to, and the benefit of, PCT application Ser. No. PCT/US2011/042100, filed on Jun. 28, 2011, and entitled "OPTIMIZING PRODUCTION OF PACKAGING PRODUCTS", which also claims priority to and the benefit of, U.S. Provisional Patent Application No. 61/359,753, entitled "REAL-TIME PACKAGING DESIGN OPTIMIZATION", filed on Jun. 29, 2010, which is incorporated herein in its entirety.

BACKGROUND

Background and Relevant Art

With the increasing availability of merchandise, products, and other items not only locally, but through a global market, the needs to properly package such materials for shipment and delivery have never been more important. Fortunately, available packaging systems can now be used to produce virtually any style of packaging.

Perhaps the single biggest factor in producing packaging for a product is that the packaging be designed to fit the contained product as precisely as possible. With a more precise fit, the contained item or product not only is less likely to be damaged, but the need for inner packaging is also reduced and possibly eliminated. In particular, when packaging materials such as corrugated cardboard are used to create a box or other packaging design, the materials are creased and folded as near to a right angle possible. Creasing and folding at right angles increases strength characteristics of the packaging materials (essentially exponentially), thereby giving a resulting box a correspondingly increased resistance to damage when stacked.

Many different styles of boxes may, however, be produced to satisfy specified dimensional constraints. Each of the different styles of boxes may have different advantages or disadvantages. For instance, some styles of boxes may be more aesthetically pleasing while others may provide greater protective features. Still other boxes styles may be more rapidly produced and/or assembled, while others may require less material for production, or less material for the assembly, closing, or other manipulation of the box template.

Because of the vast number of boxes types and other packaging materials that may be produced, each with their own positive and negative features, it may be very difficult for a person unfamiliar with a particular style of box to identify when certain styles may be used. Even if information about the types of styles is provided, it can be difficult and/or time consuming for the person producing or assembling a box to review each available option and select a preferred option. Moreover, in some circumstances, real time production factors may influence when a particular box should be used. For example, if there is a production backlog, it may be desirable to increase throughput by producing boxes that have lower production times, even if the produced boxes have lower aesthetic or protective abilities, or require more production or assembly materials. In other cases, the real-time information may indicate that there is excess capacity such that other considerations are given higher priority.

BRIEF SUMMARY

The present invention extends to methods, machines, systems, and computer program products for optimizing production of packaging products. A computer system receives packaging production information for producing a packaging product. The packaging production information at least defines the size of the packaging product. The computer system accesses a plurality of different packaging designs. Each of the plurality of different packaging designs indicates values for a combination of packaging production characteristics. The indicated values for the combination of packaging production characteristics are to be used when producing a packaging product in accordance with the packaging design.

The computer system selects a packaging design, from among the plurality of different packaging designs, for producing the packaging product. The selection is based on the suitability of the selected packaging design to a produce a packaging product in accordance with the packaging production information. The computer system sends instructions to produce the packaging product to a packaging production machine. The instructions instruct the packaging production machine to use available raw materials sufficient for the defined size and in accordance with the selected packaging design.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 3 illustrates an example packaging information table.

FIG. 4 illustrates an example user-interface for accepting packaging production information.

FIG. 5A illustrates an example packaging materials table.

FIG. 5B illustrates an example machine data table.

DETAILED DESCRIPTION

Figure 1:
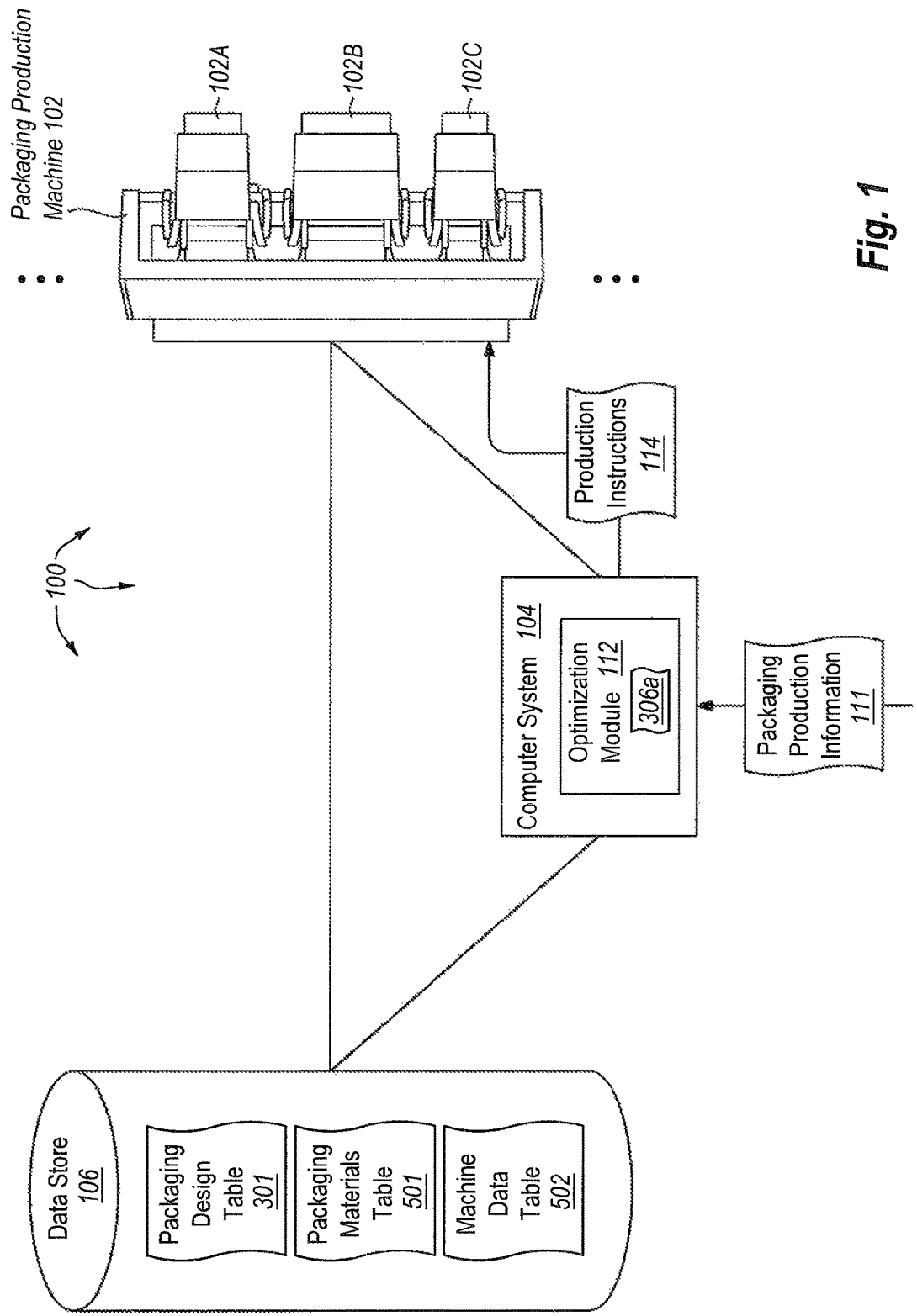
FIG. 1 illustrates an example production architecture that facilitates optimizing production of packaging products.

The present invention extends to methods, machines, systems, and computer program products for optimizing production of packaging products. A computer system receives packaging production information for producing a packaging product. The packaging production information at least defines the size of the packaging product. The computer system accesses a plurality of different packaging designs. Each of the plurality of different packaging designs indicates values for a combination of packaging production characteristics. The indicated values for the combination of packaging production characteristics are to be used when producing a packaging product in accordance with the packaging design.

The computer system selects a packaging design, from among the plurality of different packaging designs, for producing the packaging product. The selection is based on the suitability of the selected packaging design to a produce a packaging product in accordance with the packaging production information. The computer system sends instructions to produce the packaging product to a packaging production machine. The instructions instruct the packaging production machine to use available raw materials sufficient for the defined size and in accordance with the selected packaging design.

Embodiments of the present invention may comprise or utilize a special purpose or general-purpose computer including computer hardware, such as, for example, one or more processors and system memory, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, embodiments of the invention can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry or desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to computer storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that computer storage media (devices) can be included in computer system components that also (or even primarily) utilize transmission media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, package production machines, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Embodiments of the invention can efficiently and automatically determine and select optimal packaging designs to produce packaging products, such as, for example, box templates. Determining and selecting packaging designs can be based on packaging product information and defined packaging designs, and in some embodiments along with one or more of: production machine data, packaging material data, and production environment real-time considerations. Packaging production machines can then be instructed to produce packaging products in accordance with selected packaging designs.

FIG. 1 illustrates an example production architecture 100 that facilitates optimizing production of packaging products. Referring to FIG. 1, production architecture 100 includes production machines 102, computer system 104, and data store 106. Each of the depicted components and machines is connected to one another over (or is part of) a network, such as, for example, a Local Area Network ("LAN"), a Wide Area Network ("WAN"), and even the Internet. Accordingly, each of the depicted computer systems as well as any other connected computer systems, machines, and their components, can create message related data and exchange message related data (e.g., Internet Protocol ("IP") datagrams and other higher layer protocols that utilize IP datagrams, such as, Transmission Control Protocol ("TCP"), Hypertext Transfer Protocol ("HTTP"), Simple Mail Transfer Protocol ("SMTP"), etc.) over the network.

As depicted, packaging production machines 102 includes production tracks 102A, 102B, and 102C. Each of production tracks 102A, 102B, and 102C can be loaded with packaging raw materials, such as, for example, fanfold or rolled corrugated board. As depicted, each of production tracks 102A, 102B, and 1020, has a different maximum width for raw materials. As production tracks 102A, 102B, and 102C produce packaging products (e.g., box templates), packaging product machine 102 can maintain a local store of usage data. Packaging production machine 102 can include a NIC for network communication. From time to time or at desired intervals, a packaging production machine 102 can communicate usage data from the local store to computer system 104 and/or data store 106. The vertical ellipsis above and below packaging production machine 102 represent that one or more additional packaging production machines can be included in production architecture 100.

Generally, data store 106 can store different types of information for optimizing the production of packaging products. For example, data store 106 can store information for one or more packaging production machines, such as, for example, packaging production machine 102. Stored information for packaging production machines can include: packaging production machine types, cost to run packaging production machines, raw material types available at packaging production machines, and design groups used to optimize packaging production at the packaging production machines. As depicted in production architecture 100, data store 106 more specifically includes packaging design table 301, packaging materials table 501, and machine data table 502.

Computer system 104 includes optimization module 112. Generally, optimization module 112 is configured to optimize production of packaging products. In some embodiments, optimization module 112 includes real-time packaging product design functionality. When a packaging product is to be produced, optimization module 112 can refer to data in data store 106 to determine how to optimize production of the packaging product. When optimization is determined, optimization module 112 can send instructions to a packaging production machine. The instructions instruct the packaging production machine to produce a packaging product in accordance with the determined optimization.

In some embodiments, computer system 104 and/or packaging production machine 102 utilize all or some of the information from data store 106 to optimize which types and/or sizes of packaging templates are to be made by production machine 102. In some embodiments, computer system 104 and/or packaging production machine 102 also optimize which track of packaging materials should be used to produce a packaging product.

Further, although packaging production machine 102, computer system 104, and data store 106 are depicted separately, components and data depicted at production machine 102, computer system 104, and data store 106 can be combined. For example, it may be that computer system 104 is physically integrated into packaging production machine 102. Similarly, data store 106 can be physically integrated into computer system 104 and/or packaging production machine 102.

In some embodiments, a packaging product is a box template. The box template can be further manipulated, for example, folded and edges connected together, to form a box. Different types of boxes or other packaging may be used or desirable for different projects. Box size can vary based on what is being enclosed within the box. Other types of features may also be considered in determining what type and/or size box is desired for a particular use or application. Enclosing a heavy or fragile object may, for instance, dictate that a box of a certain type of material be used, or that a box that has improved protection characteristics (e.g., glue flap, integral corner protectors, full size flaps, etc.) be used.

Thus, as generally described, the components of production architecture 100 can be used to optimize production of packaging productions based on any number of different features or considerations. To facilitate the use of production architecture 100 in identifying appropriate packaging for an object, any of a number of different designs or types of packaging may be considered. Each packaging type or design may have a different shape, style, or other feature. For example, one box design may have top and/or bottom flaps that are approximately half the width of the final box. For other box designs, the top and/or bottom flaps may be up to the full width of the box. These or other types of boxes may also include glue or staple flaps for assembly, have integrated corner protectors built into the top and/or bottom flaps, or have other features or any combination thereof.

Figure 2:
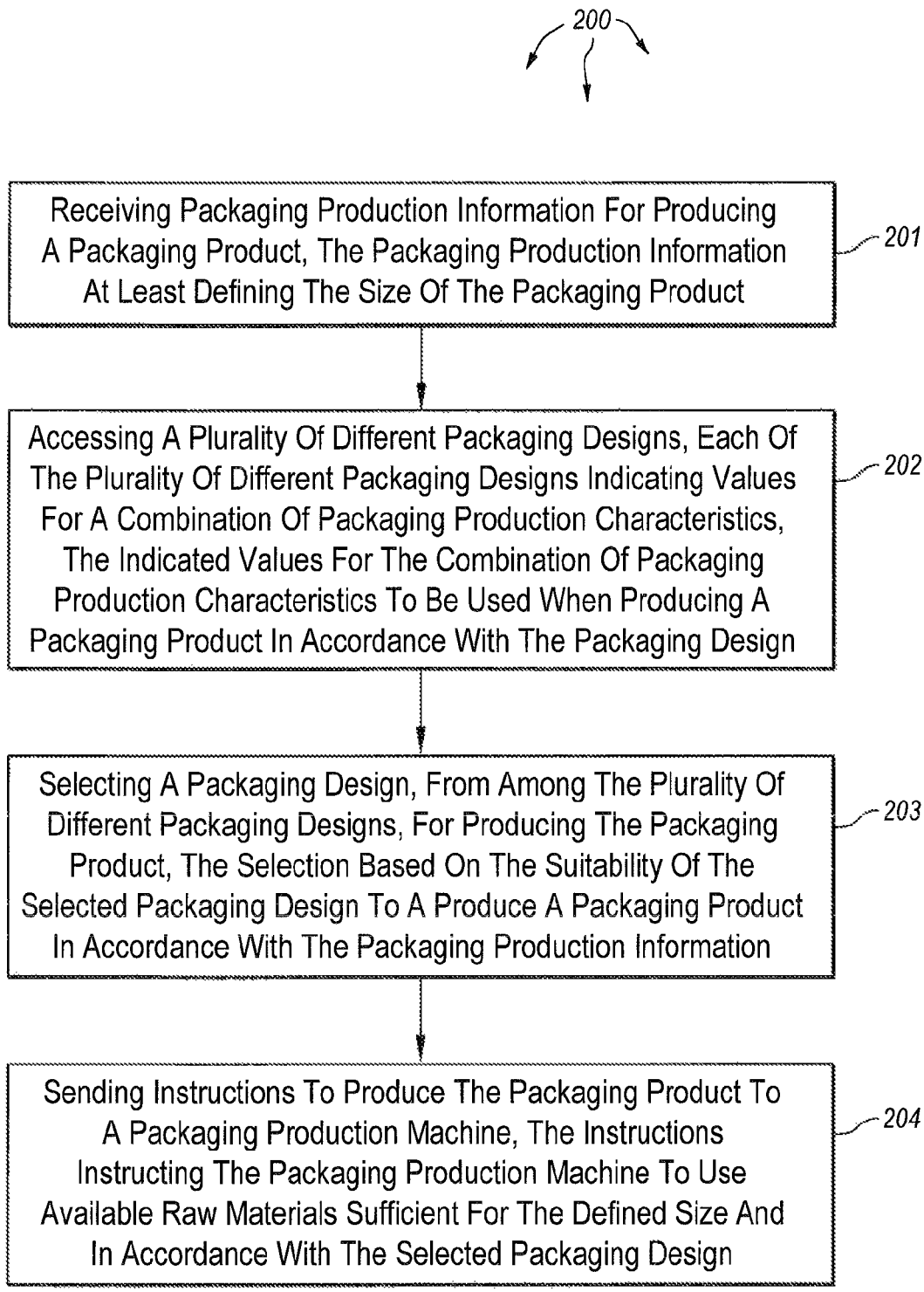
FIG. 2 illustrates a flow chart of an example method for optimizing production of packaging products.

FIG. 2 illustrates a flow chart of an example method 200 for optimizing production of packaging products. Method 200 will be described with respect to the components and data of computer architecture 100. During the description of method 200 reference will also be made to FIGS. 3, 4, 5A, and 5B Method 200 includes an act of receiving packaging production information for producing a packaging product, the packaging production information at least defining the size of the packaging product (act 201). For example, computer system 104 can receive packaging production information 111. Packaging production information 111 can define the size of a packaging product (e.g., a box). Packaging production information 111 can also include other information that optimization module 112 can use to determine how to optimize production of the packaging product. For example, the other information can include: a quantity of boxes to produce, a selected design group, production conditions, available packaging production machines, and production time cost.

In some embodiments, packaging production information 111 is formulated in an automated fashion at another computer system or even within another module of computer system 104. In other embodiments, a human user enters packaging production information 111 through a user-interface, for example, provided at computer system 104 or some other network location. Referring briefly to FIG. 4, user-interface 401 depicts different user-interface controls for entering packaging production information. An operator or other user can use use-interface 401 to enter box dimensions, a quantity of boxes to produce, a design group selection, indicate production conditions, select available production machines, and indicate a production time cost. For example, through user-interface 401, a user can select design group 302a and indicate that packaging production machine 102 is available. Packaging production information entered through user-interface 401 can be included in packaging production information 111.

Method 200 includes an act of accessing a plurality of different packaging designs, each of the plurality of different packaging designs indicating values for a combination of packaging production characteristics, the indicated values for the combination of packaging production characteristics to be used when producing a packaging product in accordance with the packaging design (act 202). For example, computer system 104 can access packaging design table 301. Referring now to FIG. 3, packaging design table 301 has columns including design groups 302, design features 310, preference score 311, options 312, restrictions 308, and description 314.

Design groups 302 include a number of design groups 302a, 302b, 302c, 302d, 302e, 302f, etc. Each design group can include one or more main designs. For example, design group 302a includes main designs 304. Each main design can relate to a specified algorithm or other design that can be scored, evaluated, or otherwise related to other main designs in a corresponding design group.

A hierarchy can be established within the design groups. For example, main design 304a has multiple packaging designs 306 defined therein. Each of packaging designs 306 is related to main design 304a of which it is a part. However, each of packaging designs 306 includes at least one different value or different option in design features 310, preference score 311, options 312, and restrictions 308 that differentiates it from other packaging designs 306. For example, different packaging designs 306 may relate to the same main design with length, width, and height dimensions interchanged, added trays and separators within a design, or to other features or aspects common to a main design.

In some embodiments, main design 304a can correspond to different types of boxes. For example, main design 304a can correspond to boxes having RSC designs, full flap boxes, integral corner protection boxes, bottom lid construction boxes with separate bottom, and lid components. Other main designs 304 correspond to other types of packaging designs. Each packaging design may have one or more associated formulas that may be used to produce the design. For example, if a main design is used to produce a rectangular box, a formula may take a desired length, width and height for the assembled box. Based on the main design a box template is produced. The box template can be folded to produce the box of the particular length, width and height, and which also offers the other characteristics or features of the particular main design.

Thus, the various packaging designs 306 can be considered as sub-designs within main design 304a. Each of packaging designs 306 can use a similar, or even essentially the same, formula with some variation.

When appropriate, computer system 104 can also access one or more packaging materials table 501 and machine data table 502. Referring to FIG. 5A, packaging materials table 501 indicates aspects of one or more packaging materials that are available within production architecture 100, some of which may be available at packaging production machine 102. For example, packaging materials table 501 indicates packaging material aspects, such as, for example, name, type, width, thickness, quantity, and cost.

Referring to FIG. 5B, machine data table 502 indicates aspects of one or more packaging production machines in production architecture 100, including packaging production machine 102. For example, machine data table 502 indicates packaging production machines including name, associated operational cost (e.g., relative cost for each second that is required to produce a packaging product), availability of different packaging materials, etc.

Method 200 includes an act of selecting a packaging design, from among the plurality of different packaging designs, for producing the packaging product, the selection based on the suitability of the selected packaging design to a produce a packaging product in accordance with the packaging production information (act 203). For example, optimization module 106 can select packaging design 306a based on the suitability of packaging product design 306a to produce a packaging product (e.g., a box template) in accordance with packaging production information 111. The contents of packaging materials table 501 and/or machine data table 502 can also be considered when selecting packaging design 306a. Any number of different algorithms considering packaging design table 301 and one or more of packaging materials table 501 and machine data table 502 can be used for packaging design selection.

In some embodiments, an algorithm processes one or more values and/or options from packaging design table 301 and one or more values and/or options from packaging materials table 501 and/or from machine data table 502 to generate score values for different packaging designs. Based on the generated score values, optimization module 106 can select a packaging design.

Method 200 includes an act of sending instructions to produce the packaging product to a packaging production machine, the instructions instructing the packaging production machine to use available raw materials sufficient for the defined size and in accordance with the selected packaging design (act 204). For example, computer system 104 can send production instructions 114 to packaging production machine 102. Packaging production instructions 114 instruct packaging production machine 102 to use raw materials sufficient to create a packaging product of the size defined in packaging production information and create the packaging product in accordance with packaging design 306a.

Figure 6:
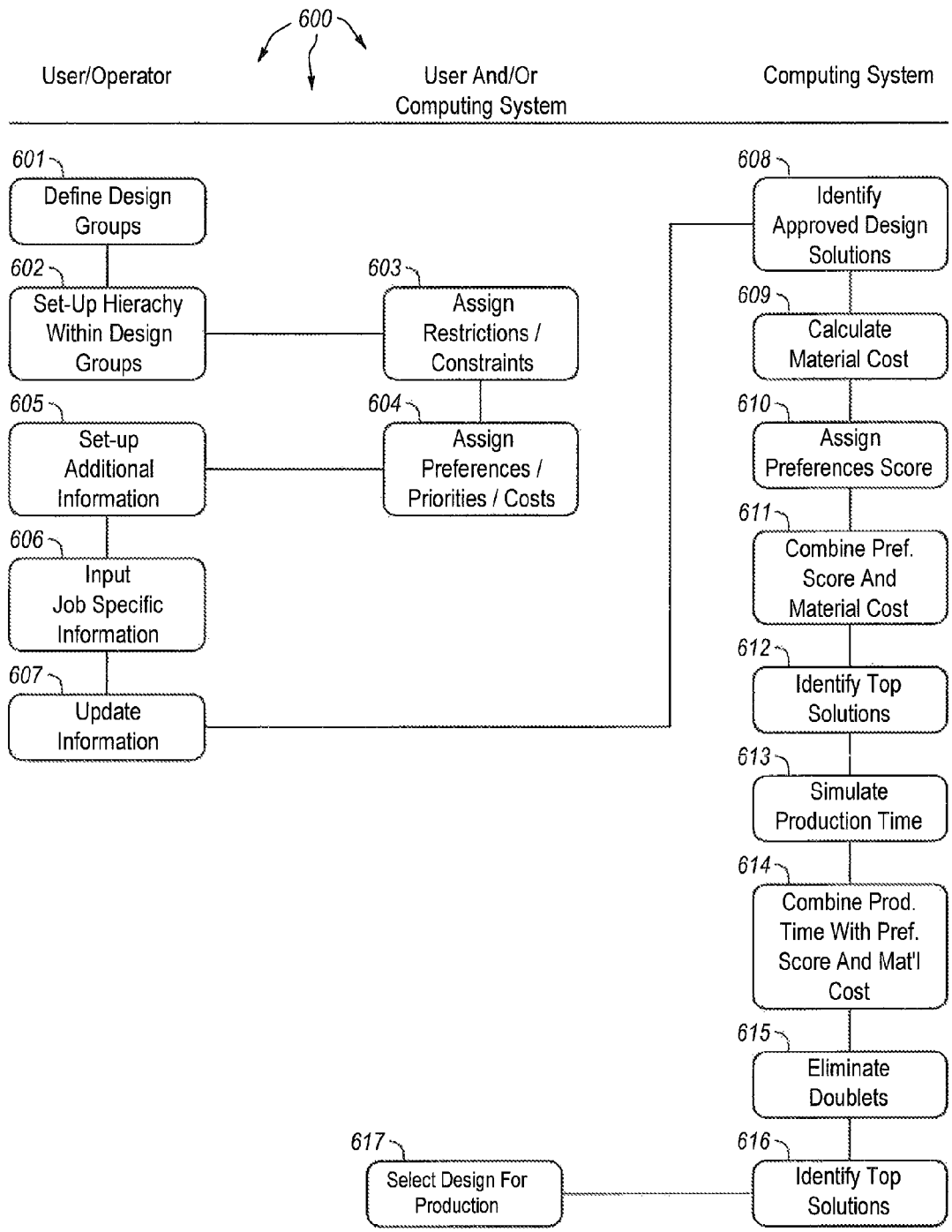
FIG. 6 illustrates a flow chart of an example method for selecting a design for a packaging product.
Figure 7:
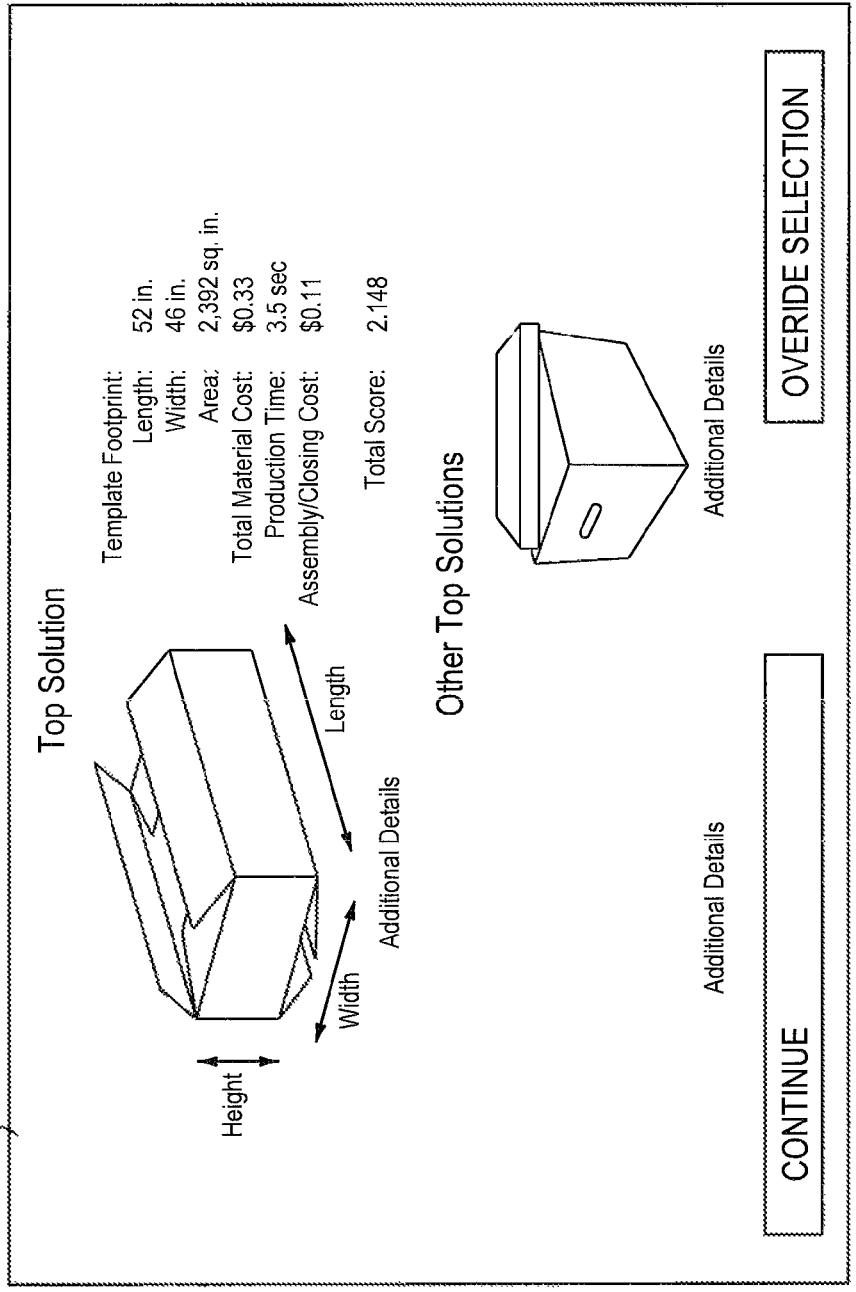
FIG. 7 illustrates an example user interface for presenting packaging designs.

Other embodiments of the invention include establishing packaging information and then using the established packaging information to select a packaging design. FIG. 6 illustrates a flow chart of an example method 600 for selecting a design for a packaging product. Method 600 will be described with respect to FIGS. 3, 4, 5A, 5B, and 7.

Method 600 includes an act of defining design groups (act 601). For example, with reference to FIG. 3, design groups 302 can be defined. Design groups 302 can relate generally to sets of different weights, preferences, restrictions, and other considerations, or combinations of the foregoing, that a user, operator, customer, or other person or entity places on a particular design. For example, different design groups may be designed for use with different products, different types of products (e.g., fragile vs. non-fragile, expensive vs. inexpensive, etc.), different customers, and the like.

Method 600 includes an act of setting up a hierarchy within design groups (act 602). For example, each design group 302 can be set up with one or more different main designs 304. Each main design 304 can relate to a particular algorithm or other design that may be scored, evaluated, or otherwise related to other main designs 304 within design group 302. Each main design 304 can also be set up with one or more packaging designs. For example, main design 304a includes packaging designs 306.

Setting up a hierarchy within design grouped can include assigning values for one or more of: design features 310, preference score 311, options 312, restrictions 308, and description 314 for each packaging design. Thus, each packaging design 306 is related to main design 304a, but includes various different options. Accordingly, the various packaging designs 306 may be considered as sub-designs within main design 304a, and can use the same formula—or essentially the same formula—but with some variation. For example, different packaging designs 306 can relate to the same main design with length, width, and height dimensions interchanged, added trays and separators within a design, or to other features or aspects common to main design 304a.

In some embodiments, setting a hierarchy includes establishing main designs that corresponding to differ types of boxes. For example, some of main designs 304 may correspond to boxes having RSC designs, full flap boxes, integral corner protection boxes, bottom lid construction boxes with separate bottom and lid components. Other of main designs 304 correspond to other types of packaging designs. Each packaging design may have one or more associated formulas that may be used to produce the design. For example, if a main design is used to produce a rectangular box, a formula may take a desired length, width and height for the assembled box, and then produce a box template that can be folded to produce the box of the particular length, width and height, and which also offers the other characteristics or features of the particular main design.

In some embodiments, a single type of packaging may be produced by using the desired length, height, and width of the desired box. There are, however, up to six different combinations that may be obtained simply by varying the length, width, and height values. Thus, if a user inputs length, height, and width values, the various packaging designs 306 may relate to different combinations (e.g., using the length as the height, the height as the width, and the width as the length). A user can input the dimensions in one way and then optimization module 106 can evaluate the dimensions in six different combinations. For example, a box may have the following dimensions:

Dimension 1: 12 inches
Dimension 2: 18 inches
Dimension 3: 14 inches.

This same box may also be described in any of the following manners:

Length/Width/Height:
A: 12 in by 18 in by 14 in
B: 12 in by 14 in by 18 in
C: 18 in by 12 in by 14 in
D: 18 in by 14 in by 12 in
E: 14 in by 12 in by 18 in
F: 14 in by 18 in by 12 in Ultimately, any of these combinations of the same dimensions may be used to produce a box that has the same overall dimensions (namely 12 inches by 18 inches by 14 inches). However, as the dimensions are input into a formula in a particular form, the size and shape of the two-dimensional template that may be folded to produce the box of the specified size may be varied. In some cases, the width and length of the template can change based on the particular combination of length/width/height dimensions. Particularly where a packaging production machine has access to a limited set of types of materials (e.g., fanfold or rolled corrugated board of particular widths), the size of the template may make a difference in the overall cost to produce the box. The different dimensional combinations may also affect the amount of materials used to assemble or close the box, the time to assemble the box, the difficulty in assembling the box, and the like. For example, boxes of different dimensions may require different amounts of glue or other adhesives, staples, strapping bands, or other materials used to prepare, erect, mark, and/or close a box.

To illustrate, entered dimensions for a first box template can be about 50 inches wide and about 64 inches long. Entered dimensions for a second box template can be about 80 inches wide and about 40 inches long. Thus, the total area of both the first box template and the second box template are 3200 $in^2$. A packaging production machine may have access to fanfold or rolled production materials that are 55 inches wide and 100 inches wide. Thus, even though the overall areas are the same, more packaging materials may be necessary to produce the second box template.

For example, if the second box template is produced from the 100 inch wide material, 4000 $in^2$ (i.e., 100 inches by 40 inches) of production materials are used to product the second box template. If the second box template is rotated and produced from the 55 inch wide fanfold, 4400 $in^2$ (i.e., 55 inches by 80 inches) of production materials are used to produce the second box template. In contrast, the first box template may be produced from the 55 inch wide material, such that the total material used is 3520 $in^2$ (i.e., 55 inches by 64 inches).

Accordingly, changing the manner in which dimensions are input to produce a same type of box may have an impact on the box or the cost to produce a box. Entered dimensions can also affect other aspects of packaging production. For example, instance, the structural strength of a box may also change (e.g., by changing the length of a glue/staple flap), the difficulty of assembly may increase, the overall aesthetic appearance of the box may change, or a number of other characteristics or features may changed based solely on which dimensions are used as the length, width, or height, for example. Moreover, other changes to a main design 304 may also be addressed within a sub-design (e.g., adding inserts or dividers to a tray or within a box).

Setting up a hierarchy within design groups can also include specifying one or more design features 310, such as, for example, aesthetics, labor, production capacity, assembly/material costs, and protection for each packaging design. Setting up a hierarchy can also include specifying a preference score 311 for each packaging design Setting up a hierarchy within design groups can also include specifying options 312 for each packaging design. For example, options 312 can be specified to indicate whether a design may be rotated, mirrored, and have multiple outputs for a particular packaging design 306 or main design 304. In general, rotated or mirrored versions of a main design (or of a particular packaging design) may have generally the same overall two-dimensional template dimensions of a corresponding design. There can advantages to a rotating a design. For example, packaging materials (e.g., fanfold or rolled corrugated materials) may be available in only certain widths. A template that is 60 inches wide by 40 inches long may thus be produced by fanfold material that is 75 inches wide. However, by rotating the template, the same design may be produced using fanfold material that is 42 inches wide, thereby reducing the overall material usage in production of the template.

For packaging designs 306 with multiple outs enabled, multiple templates may be produced side-by-side (or "tiled"). That is, the entire width of production materials (e.g., fanfold corrugated board) can be used to produce a plurality of (e.g., two) packaging products (e.g., box templates) essentially in parallel. Enabling multiple outs may allow multiple identical designs to be produced side-by-side, or may allow different designs to be produced side-by-side.

In the foregoing description, particular mention is made of the size of fanfold or other packaging material and/or the dimensions of packaging and/or packaging templates. It should be appreciated that these dimensions are merely exemplary and provided to illustrate example circumstances in which different variations of a design may be used. In packaging design table 301, no dimensions are included for design groups 302, main designs 304, or packaging designs 306. While this is merely optional, the exclusion of dimensions may allow for a broader range of packaging to be considered.

For example, instead of defining a design group for each product size or each possible packaging size, a definition similar to that in packaging design table is more robust and allows product types to be assigned for each design group 302. Each main design 304 and packaging design sub-group 306 may have a formula for calculating the size of the packaging template such that a wide range of packaging sizes may be evaluated. Moreover, in some embodiments, one design group may be within the hierarchy of another design group. For instance, by selecting one design group, one or more other design groups and the main and/or packaging designs 304, 306 therein may also be considered.

In some embodiments, a user or computer system assigns values for restrictions 308 for a design group. Method 600 includes an act of assigning restrictions/constraints (act 603). In packaging design table 301, main designs 304 or packaging designs 306 can assign restrictions and/or constraints (e.g., restrictions 308). For example, a packaging design be assigned a size restriction thereon (e.g., maximum dimension must be less than 34 inches). In this particular example, a packaging design may allow for any dimension to be up to a specified value. If the dimension exceeds the specified value, there is a possibility that the template may not be producible by a desired packaging production machine, that it will be produced with undesired crease lines, or have some other feature, or a combination thereof.

Any type of constraint or restriction can be assigned. For example, absolute size or dimensional restrictions may be applied, relative size or dimensional restrictions may be applied (e.g., length to width ratio must be less than 7:1). Restrictions or constraints may limit or require a particular packaging production machine be used to produce the design, or that a particular quality of fanfold material be used. Of course other considerations can be used in identifying restrictions or constraints. Thus, a restriction or constraint may be used to specify conditions that, when existing, exclude the particular design from further consideration or use.

In some embodiments, a user or computer system assigns a value for preference score 311 or for other priorities or costs for a design group. Method 600 includes an act of assigning preferences/priorities/costs (act 604). Preferences or priorities may be assigned in any of a number of different categories. For example in packaging design table 301 preferences or priorities may be assigned to design features 310. Example design features that may be used in setting preferences, priorities, costs, and the like include aesthetic appearance, labor time, production capabilities, assembly/closing material costs, protective capabilities, or other preferences, or combinations thereof.

One or more (possibly all) combinations of values for design related features 310 can be weighted. Values can be weighted and assigned automatically, or can be assigned by an engineer or other user, operator, or person knowledgeable of the system described herein. For example, each different design feature may be weighed differently. If a particular design group 302 is likely to be used with fragile or heavy objects, the protective abilities of the box may be particularly important. On the other hand, if a design group 302 is to be used for expensive products or high-end customers, aesthetic appearance may be particularly important. For high volume products, the labor time, production capabilities, assembly material costs, and the like can be valued highly.

Accordingly, each design group 302 can be considered by weighting the different design-related features 310 in any number of different manners. Moreover, the different design groups 302 can have different types of main designs 304 and packaging designs 306 considered. For example, some design groups 302 may not consider boxes with integral corner protectors (e.g., for products that don't need any additional protection or which are oddly shaped, while only some design groups 302 may consider templates that are produced in two or more separate parts (e.g., a design group 302 for large products). Thus, each design group 302 may be customized not only in the manner in which the features 310 are evaluated and weighed, but in what main designs 304 and/or packaging designs 306 are included as options within the particular design group 302.

A number of different design features 310 and a preference score 311 are expressly depicted in packaging design table 301. Some packaging designs may not be assigned a value for each of design features 310 and/or for preference score 311. In some embodiments, none of design features 310 are assigned values. Thus, the value for preference score 311 may be a single value assigned to a particular design. The value for preference score 311 can be based on a particular combination of design related features deemed important for the design group. The preference value may be a numerical value (e.g., on a scale of 0 to 100), a letter value (e.g., a value between A and F), a cost value (e.g., an associated cost to produce the box based on the design factors 310), or any other type of value, or a combination thereof.

Method 600 includes an act of setting up additional information (act 605). For example, referring now to FIGS. 5A and 5B, packaging materials table 501 and machine data table 502 can also be set up. Packaging materials table 501 can be set up to describe aspects of the one or more packaging materials that are available within production architecture 100. For example, packaging materials table 501 describes aspects of packaging materials such as the widths of fanfold production materials that are available, the available quantities of such fanfold materials, and the cost of each type of material. Machine data table 502 can be setup to describe aspects of one or more packaging production machines that are available within production architecture 100. For example, machine data table 502 describes aspects of packaging production machines such as cost per second to operate (operation cost) and access to different packaging material sizes.

Embodiments of the invention include a real-time design optimization system that uses the available information to select or identify one or more optimal packaging designs. Based on design information, packaging material information, and packaging production machine information, a design for a packaging product can be selected. The real-time design optimization system can also consider further user entered job specific information (e.g., from an operator) to facilitate design selection.

Method 600 includes an act of inputting job specific information (act 606). For example, turning briefly again to FIG. 4, the real-time design optimization system can consider job specific information entered through user-interface

401. Job specific information can indicate a job for a single box, multiple identical boxes, or multiple different boxes. When entering information at user-interface 401, an operator or other user may input information such as the design group that is to be used. As noted above, each design group may include different types of packaging designs.

Additionally, or alternatively, each design group may weight different design-related features in a different manner. For instance, as depicted in user-interface 401 one or more design groups 302 identified along with a basic description of that design group. The description may include size, weight, product category, or other information that an operator may use to identify what design group is to be considered. In some embodiments, multiple design groups are selected by the user for consideration.

Method 600 includes an act of updating information (act 607). For example, user-interface 401 depicts various fields in which the user may enter dimensional information. An operator may know, for example, that a desired box has dimensions A, B and C, in which case such dimensions may be entered into the appropriate fields of user-interface 401. The dimensional information may be entered in a number of different units as well. For example, the system may request the dimensions in inches, feet, centimeters, meters, or other dimensions. The user may also be able to specify the units in which the specified value is input. For instance, a drop-down box may allow the user to specify that the units are provided in inches rather than centimeters.

Other information can also be input. For example, at user-interface 401, an operator or other user can enter information about production conditions. If an incident has occurred that has slowed or stopped production, this condition may be entered. A check box or other input mechanism can be used to indicate that production has stopped or slowed. User-interface 401 can also be used to input a time cost. The time cost can be increased as production stops or slows. As described, the time cost can be used to evaluate production time. For high production costs, a real-time optimization system can look for solutions that reduce production time. Additional information may also be input. For example, additional information about the availability of fanfold or other production materials, identification of production machines that are offline, or other information, or combinations thereof, may also be specified.

Method 600 includes an act of identifying approved design solutions (act 608). For example, a real time design optimization system can consider dimensional information and other information specified by a user in view of design restrictions to evaluate each main design in a specified design group. Designs that can satisfy user entered information in view of design restrictions are identified as approved design solutions. A list of approved solutions can be displayed to a user and/or stored (e.g., in data store 106).

A real time design optimization system can evaluate the restrictions or other constraints specified for any design in the design group. If, for example, a design has a restriction that is not satisfied (e.g., size restriction, dimensional restriction, packaging production machine limitation, material quality limitation, etc.), that design can be excluded from a list of available possible solutions. Other restrictions or constraints can also be evaluated. For example, additional restrictions may relate to availability of fanfold or production machines (e.g., can only be produced on a particular machine), time costs (e.g., only use if the time cost is below a certain value or between certain values), or based on other factors, or any combination of the foregoing.

Method 600 includes an act of calculating material cost (act 609). For example, a real time design optimization system can identify fanfold widths that are available at packaging production machines (e.g., at packaging production machine 102). For each approved solution, the real time design optimization system can calculate the amount of fanfold material used to produce the design. The amount of fanfold material used can be based not solely on the footprint of the packaging template, but on the overall usage of fanfold material based on the fanfold width.

Accordingly, a packaging template measuring 50 inches wide by 30 inches long may have an area of 1500 $in^2$. If, however, the packaging template is produced from fanfold that measures 60 inches wide, the overall material usage may be 1800 $in^2$. A rotated version of the same design could potentially be produced from fanfold measuring 32 inches wide, such that the rotated version may be produced using approximately 1600 $in^2$ of fanfold material. Thus, calculating the material cost may also include considering the available materials available to the packaging production machines, including their different sizes, qualities, and quantities.

With the fanfold material usage known, a cost can be calculated. For example, for fanfold material having a cost of \$0.03 $ft^2$, the overall cost of 1600 $in^2$ of fanfold material may be about \$0.33. The overall cost of 1800 $in^2$ of fanfold material may then be about \$0.38. Accordingly, based on the different widths of fanfold material available, and the various main designs 304 and sub-designs 306 within a design group 302, a number of different costs may be obtained for fanfold material. Furthermore, different fanfold material widths may have different associated costs. For instance, quality of fanfold may vary such that the cost of one fanfold material is higher relative to another (e.g., cost per square foot varies for different fanfold). In other embodiments, the producer may want to close-out a particular width of fanfold so that a lower cost may be assigned to such fanfold material.

The amount of material used to produce a design—and thus the material cost for a box or other package—can be a factor in determining what box to produce. However, other factors can also be considered. For example, as described, each main or packaging design 304, 306 within a design group 302 may have particular values or preferences assigned based on design-related features 310. Accordingly, a real time design optimization system can consider a number of the design-related features before identifying an optimal design.

For example, a box template produced with lower material cost may nonetheless have costly assembly/closing materials, or a high labor cost associated with assembly the box. These and other factors can outweigh the lower material cost, resulting in selection of an alternative design. In other embodiments, the low material cost design may also have poor aesthetic or protective capabilities. As a result, when a real time design optimization system evaluates the various aspects, a design group with a high weight or preference to aesthetic qualities and/or protective qualities may also outweigh the lower relative material cost of one design over another.

Method 600 includes an act of assigning preferences scores (act 610). For example, a real time design optimization system can assign a preference score for each approved solution from act 608. Method 600 includes an act of combining preference score and material cost (act 611). For example, a real time design optimization system can combine calculated material costs from act 609 with assign preference scores from act 610.

Any desired algorithm for combining a preference score and material cost, or otherwise producing the score value may be used. For example, a set of approved design options may include the following values and material cost values as depicted in Table 1:

TABLE 1

|  | Preference Value | Material Cost |
|---|---|---|
| Design 1 | 83 | $0.36 |
| Design 2 | 44 | $0.24 |
| Design 3 | 60 | $0.28 |
| Design 4 | 85 | $0.27 |
| Design 5 | 92 | $0.34 |
| Design 6 | 68 | $0.30 |
| Design 7 | 71 | $0.30 |
| Design 8 | 56 | $0.28 |
| Design 9 | 75 | $0.35 |
| Design 10 | 77 | $0.33 |

The Preference Values and Material Cost values for each design may then be combined in a manner that produces an overall score. According to one example, the preference and material cost values may be normalized and given equal weight in computing the preference score. For example, the preference value for each design may be normalized by dividing each value by the maximum Preference Value. Thus, Design 5 may obtain a normalized Preference value of 1.00.

The Material Cost values may also be normalized. For example, the material cost value for each design may be normalized by dividing each value by the minimum Material Cost value. Thus, Design 2 may obtain a normalized Material Cost value of 1.00. If an assumption is made that a value having twice the cost as Design 2 has a normalized value of 0.00, then the normalized value may be obtained by the equation:

$$NMCV = MCV * \frac{-1}{MMCV} - 2$$

where:

NMCV is the Normalized Minimum Material Cost Value;

MCV is the Material Cost Value; and

MMCV is the Minimum Material Cost Value.

The normalized preference values and material cost values can then weighted equally and summed. With the designs sorted by Score Value Table 2 depicts score values for the designs form Table 1:

TABLE 2

|  | Normalized Preference Value | Normalized Material Cost | Score Value |
|---|---|---|---|
| Design 4 | 0.924 | 0.875 | 1.799 |
| Design 5 | 1.000 | 0.583 | 1.583 |
| Design 7 | 0.772 | 0.750 | 1.522 |
| Design 6 | 0.739 | 0.750 | 1.489 |
| Design 3 | 0.652 | 0.833 | 1.486 |
| Design 2 | 0.478 | 1.000 | 1.478 |
| Design 10 | 0.837 | 0.625 | 1.462 |

TABLE 2-continued

|  | Normalized Preference Value | Normalized Material Cost | Score Value |
|---|---|---|---|
| Design 8 | 0.609 | 0.833 | 1.442 |
| Design 1 | 0.902 | 0.500 | 1.402 |
| Design 9 | 0.815 | 0.542 | 1.357 |

Accordingly, in Table 2, it can be seen that Design 4 has the highest Score Value according to the particular combination of material costs and preference values assigned in the selected Design Group. The used preference values may be based on one or more algorithms or considerations that place different weights, preferences or priorities on different design features 310. Moreover, the described normalization method is merely one mechanism for computing a score value based on a preference value and a material cost.

In other embodiments, the preference and/or material costs may be normalized, weighted, or otherwise used, or a combination of the foregoing, in other manners. For example, a preference value can be translated into a direct cost that may be added to the material cost such that the material cost need not be normalized. In another embodiment, the material cost is normalized based on a difference between the maximum and minimum costs, rather than on the minimum material cost. In still other embodiments, different calculations, algorithms, normalizations, and/or other factors, or a combination thereof may be considered.

Method 600 includes an act of identifying top solutions (act 612). For example, a real time design optimization system can identify top solutions from Table 2. Thus, it may be that the score values from Table 2 are used to limit the number of solutions for additional or final consideration. Further, a design group 302 may include a number of different main designs 304 and a number of packaging designs 306 as sub-designs within a main design 302. Indeed, there may easily be dozens if not hundreds or thousands of possible options that may be scored and considered. Thus, the score value is used to identify a top set of solutions, such as, for example, the top ten solutions. From Table 2, the top seven solutions can be identified, although more or fewer than seven or ten solutions may also be identified as the top solutions.

Whether or not a number of top solutions are identified, a real time design optimization system may then choose one design to use for producing a packaging product. In some embodiments, the chosen design is selected based exclusively on the score value. In other embodiments, the top solutions may be provided to an operator via a user interface to allow the user to select. The user interface can also indicate the relative score values and potentially the calculations or basis of the score value calculation In further embodiments, the identified top solutions are further processed to further refine the list of top solutions. For example, the top solutions can further be evaluated based on production time. As noted herein, production time may be particularly important in some industries and/or at certain production times. During a busy production system, packaging production machines may create a bottleneck such that reducing the production time will allow greater throughput. In other times, a production slow-down or stoppage may also create a production backlog that increases the importance of production time. In still other cases, production machines may have excess capacity available such that production time is of little or no concern.

Method 600 includes an act of simulating production time (act 613). For example, a real time design optimization system can simulate production time for top solutions identified in act 612. In some embodiments, simulating production times is based on knowledge the real-time design optimization system maintains about the one or more production machines. Production time can be simulated for top solutions or all solutions based on resource requirements for corresponding calculations.

Depicted in Table 3, the top seven of the previously identified ten designs have been selected for processing by simulating the production time. While the following table includes the production time, an associated cost may additionally or alternatively be used. For example, if different machines are used and have different associated costs, the production value may be a cost value associated with the particular machine on which the design template will be produced.

TABLE 3

|  | Normalized Preference Value | Normalized Material Cost | Production Time |
|---|---|---|---|
| Design 4 | 0.924 | 0.875 | 3.1 |
| Design 5 | 1.000 | 0.583 | 2.75 |
| Design 7 | 0.772 | 0.750 | 2.45 |
| Design 6 | 0.739 | 0.750 | 2.77 |
| Design 3 | 0.652 | 0.833 | 2.9 |
| Design 2 | 0.478 | 1.000 | 2.8 |
| Design 10 | 0.837 | 0.625 | 2.55 |

Method 600 includes an act of combining production time with preference score and material cost (act 614). For example, a real time design optimization system can combine production times from act 613 with preference scores from act 610 and material costs from act 609. Production time can be normalized in a manner similar to that shown above for normalizing the material cost (i.e., such that Design 7 has a value of 1.00 and a design taking twice as long to produce would have a normalized value of 0.00). Table 4 depicts Total scores for the Top seven designs from Table 1. Total score can weight preference value, material costs, and production time equally.

TABLE 4

|  | Normalized Preference Value | Normalized Material Cost | Production Time (s) | TOTAL SCORE |
|---|---|---|---|---|
| Design 4 | 0.924 | 0.875 | 0.735 | 2.534 |
| Design 7 | 0.837 | 0.625 | 1.000 | 2.462 |
| Design 5 | 1.000 | 0.583 | 0.878 | 2.461 |
| Design 10 | 0.478 | 1.000 | 0.959 | 2.437 |
| Design 6 | 0.772 | 0.750 | 0.869 | 2.391 |
| Design 2 | 0.652 | 0.833 | 0.857 | 2.343 |
| Design 3 | 0.739 | 0.750 | 0.816 | 2.305 |

As shown Table 4, Design 4 has been given the highest overall score, while of the top designs, Design 3 has the lowest overall score. The values obtained for the score can be based on a sum of normalized values; however, average scores, cost values, weighted sums, or other algorithms or manners for computing a total score may be used.

Method 600 includes an act of eliminating doublets (act 615). For example, a real time design optimization system can eliminate doublets from the designs in Table 4. The real time design optimization system can further refine and/or process scores and designs to identify those designs that are at least significantly similar and potentially alike in all significant aspects. For example, if any designs have identical or very similar Preference Values, Material Costs, and/or Production Times, all but one of such similar designs (i.e., doublets) can be eliminated. Additionally, or alternatively, consideration of doublets for elimination may include evaluating other aspects, including the type of design (e.g., RSC full flap, integrated corner protectors, bottom lid, etc.) or other aspects.

Method 600 includes an act of identifying top solutions (act 616). For example, a real time design optimization system can identify the top solutions from Table 4 (either with or without doublet elimination). For example, the highest scoring design may be selected and transferred for production. Alternately, a top number of designs (e.g., top 5 designs) can be selected. If a top number of designs is selected, any number may be used. For example, more or fewer than 5 designs may be selected as the top number of designs.

Method 600 includes an act of selecting a design for production (act 617). For example, a real time design optimization system can select a design for production at packaging production machine 102. In some embodiments, a real time design optimization system automatically transfers the top scored design for production as. In other embodiments, however, an operator may be notified of the top number of designs, or optionally of all or some other number of designs. For example, referring to FIG. 7, user-interface 701 gives an operator or other user the option to choose a design from among the top designs.

If the top three designs are provided to the operator, the operator can choose to do nothing, thereby resulting in a top scored design being transferred for production. The operator may actively select that the operator is not overriding the choice, or after a specified time without operator selection, the top design may be transferred to the packaging production machine for operation. Alternatively, if the operator desires a different design to be transferred for production, the operator may select one of the other options (e.g., the designs ranked as the top second through fifth) designs. In still another alternative, the operator may indicate that no solution is desired and the operator can select a different available design (e.g., one of the previously scored but not top designs).

As further depicted in user-interface 701, pictures of the assembled box, box template, or some other image may be used to graphically illustrate the various available boxes. In other embodiments, boxes are identified by information or name only. Accordingly, it should be appreciated that it is not necessary that an image of a box or template be provided to the operator.

Accordingly, embodiments of the invention include automatically optimizing production of packaging products based on stored and/or real-time information. In some embodiments, a request for a packaging product is received and a real-time design optimization system accesses information about one or more design groups. The one or more design groups include multiple design options. The multiple design options are scored based on stored and/or real-time criteria. Based on the score, one or more top designs are identified for production and/or selection by an operator of the system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed:

1. A method for optimizing production of packaging products, the method comprising:
   hierarchically arranging a plurality of design groups to include, for at least some of the plurality of design groups, a plurality of main designs, wherein one or more of the plurality of main designs includes therein a plurality of packaging designs;
   assigning restrictions applicable to one or more design groups, main designs, or packaging designs, wherein the restrictions include a requirement that a particular packaging design only be created by a particular packaging production machine;
   assigning design feature values to the plurality of packaging designs, the design feature values including values for multiple design related features including material cost in combination with one or more of aesthetics, labor time, labor cost, protection capabilities, and assembly/closing material costs;
   calculating a single preference score value for each packaging design, selected from the plurality of packaging designs, based upon each of the design feature values;
   calculating an overall score by combining, for each packaging design, a calculated material cost, and the respective single preference score value;
   receiving packaging production information for producing a packaging product, the packaging production information at least defining the size of the packaging product;
   identify one or more main designs and packaging designs within the specified one or more design groups that are available to satisfy the packaging product request based on the assigned restrictions;
   accessing the plurality of packaging designs associated with the specified one or more design groups, wherein each of the plurality of packaging designs is associated with the single preference score value;
   selecting a packaging design that corresponds with the top overall score, from among the plurality of packaging designs, for producing the packaging product; and
   sending instructions to produce the packaging product to a packaging production machine, the instructions instructing the packaging production machine to use available raw materials sufficient for the defined size and in accordance with the selected packaging design.

2. The method as recited in claim 1, wherein accessing the one or more packaging designs comprises accessing a packaging design table, the packaging design table containing entries for at least a portion of the plurality of packaging designs, each of the at least a portion of the plurality of packaging designs indicating the design feature values for packaging production characteristics, the design feature values to be used when producing a packaging product in accordance with the packaging design.

3. The method as recited in claim 1, wherein calculating the single preference score value for each packaging design comprises:
   selecting a particular packaging material size from among a finite number of packaging material sizes; and
   determining a quantity of packaging materials used to produce said packaging product using said selected packaging material size.

4. The method as recited in claim 3, wherein selecting a particular packaging material size comprises selecting a particular packaging material size based on one or more of:
   determining how the selected packaging design can be rotated;
   determining if the packaging product can be produced with multiple-outs;
   determining how dimensions for the packaging product can be swapped; and
   determining if the packaging product can be mirrored.

5. The method as recited in claim 1, wherein calculating the single preference score value for each packaging design comprises applying real-time data to calculate single preference score values for at least some of plurality of different packaging designs, the real-time data being dynamically adjustable.

6. The method as recited in claim 5, wherein applying real-time data to calculate single preference score value for at least some of plurality of different packaging designs comprises calculating single preference score values based on one or more of estimated production time and estimated production cost of the packaging production, the production time and production cost being dynamically modifiable when production is backlogged, behind schedule, or stopped.

7. A method for identifying, within a packaging system, a design for producing a one or more main designs and packaging designs, the method comprising:
   receiving definitions of a plurality of design groups;
   hierarchically arranging the plurality of design groups to include, for at least some of the plurality of design groups, a plurality of main designs, wherein one or more of the plurality of main designs includes therein a plurality of packaging designs;
   assigning restrictions applicable to one or more design groups, main designs, or packaging designs, wherein the restrictions include a requirement that a particular packaging design only be created by a particular packaging production machine;
   assigning design feature values to the plurality of packaging designs, the design feature values including values for multiple design related features including material cost in combination with one or more of aesthetics, labor time, labor cost, protection capabilities, and assembly/closing material costs;
   calculating a single preference score value for each packaging design, selected from the plurality of packaging designs, based upon each of the design feature values;
   receiving a request for production of a box of a particular size and specifying one or more of the plurality of design groups;
   identify one or more main designs and packaging designs within the specified one or more design groups that are available to satisfy the packaging product request based on the assigned restrictions;
   calculating a material cost to produce packaging product using each of the one or more main designs and packaging designs;
   calculating an overall score by combining, for each of the one or more main designs and packaging designs, the corresponding calculated material cost, and the respective single preference score value;
   selecting a particular available design from the one or more main designs and packaging designs that corresponds with the top overall score;
   selecting a packaging production machine to produce the packaging product in accordance with the selected particular available design the restrictions, the selected packaging production machine selected based on characteristics of the packaging production machine, including raw materials available at the packaging production machine; and sending instructions to the selected packaging production machine to produce the packaging product from raw materials available at the packaging production machine and in accordance with the particular available design.

8. The method as recited in claim 7, wherein identifying the one or more main designs and packaging designs comprises determining a footprint size for each of the plurality of different packaging designs.

9. The method as recited in claim 7, wherein selecting the particular available design comprises:
determining an amount of corrugated fanfold material for producing the packaging product for each of the one or more main designs and packaging designs; and
scoring each of the one or more main designs and packaging designs based at least in part on the determined amount of corrugated fanfold material for producing the packaging product.

10. The method as recited in claim 9, wherein selecting the packaging production machine to produce the packaging product comprises selecting the packaging production machine based on the determined amount of corrugated fanfold material for producing the box.

11. The method as recited in claim 9, wherein scoring each of the one or more main designs and packaging designs comprises scoring each of the one or more main designs and packaging designs based on real-time data for the packaging system.

12. The method as recited in claim 11, wherein scoring each of the one or more main designs and packaging designs based on the real-time data for the packaging system comprises scoring each of the one of more main designs and packaging designs based on one or more of a production backlog, a production slow down, or a production stoppage, within the packaging system.

13. The method as recited in claim 9, wherein scoring each of the one or more main designs and packaging designs comprises scoring each of the one or more main designs and packaging designs based on: design features of each packaging design, on template options of each packaging design, and on template restrictions for each packaging design.

14. The method as recited in claim 7, further comprising:
the packaging production machine receiving the instructions; and
the packaging production machine producing the packaging product in accordance with the selected packaging design from the raw materials available to the packaging production machine.

15. A computer system for selecting a design for producing a box template, the box template convertible into a box, comprising:
one or more processors;
at least one display unit; and
one or more computer-readable storage devices having stored there on computer-executable instructions that, when executed at the one or more processors, cause the computer system to:
receive definitions of a plurality of design groups;
hierarchically arrange the plurality of design groups to include, for at least some of said plurality of design groups, a plurality of main designs, wherein one or more of said plurality of main designs includes therein a plurality of packaging designs;
assign restrictions applicable to one or more design groups, main designs, or packaging designs, wherein the restrictions include a requirement that a particular packaging design only be created by a particular packaging production machine;
assign design feature values to one or more design groups, main designs, or packaging designs, said design feature values including values for multiple design related features including material cost in combination with one or more of aesthetics, labor time, labor cost, protection capabilities, and assembly/closing material costs;
calculate a single preference score value for each packaging design based upon each of the design feature values;
receive a request for a packaging product of a particular size and specifying one or more of said plurality of design groups;
identify one or more main designs and packaging designs within the specified one or more design groups that are available to satisfy the packaging product request based on the assigned restrictions;
calculate a material cost to produce the box template using each available design;
calculate an overall score by combining, for each available design, the corresponding calculated material cost, and the respective single preference score value;
select a particular available design that corresponds with the top overall score; and
send instructions to produce the particular available design to a packaging production machine, the instructions instructing the packaging production machine to use available raw materials sufficient for the defined size and in accordance with the particular available design.

16. The computer system as recited in claim 15, further comprising computer-executable instructions that, when executed, cause the computer system to score each available design based on a simulated production time for producing the box template using the available design.

17. The computer system as recited in claim 15, further comprising computer-executable instructions that, when executed, cause the computer system to display an output interface at a display unit, the output interface identifying at least a top scored design.

18. The computer system as recited in claim 17, further comprising computer-executable instructions that, when executed, cause the computer system to display an output interface comprise computer-executable instructions that, when executed, cause the computer system to:
identify a packaging design that was automatically selected based on the overall score;
indicate one or more other packaging designs in addition to the automatically selected packaging design; and
receive an override selection, the override selection selecting one of the one or more other packaging designs to use when producing the box template.

* * * * *